United States Patent
Bachman et al.

(10) Patent No.: US 8,824,707 B2
(45) Date of Patent: Sep. 2, 2014

(54) ACOUSTIC SUBSTRATE

(75) Inventors: Mark Bachman, Irvine, CA (US);
Guann-Pyng Li Li, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 232 days.

(21) Appl. No.: 13/340,240

(22) Filed: Dec. 29, 2011

(65) Prior Publication Data
US 2012/0097636 A1   Apr. 26, 2012

Related U.S. Application Data

(62) Division of application No. 11/956,756, filed on Dec. 14, 2007.

(60) Provisional application No. 60/870,354, filed on Dec. 15, 2006.

(51) Int. Cl.
*H04R 31/00* (2006.01)
*H04R 19/00* (2006.01)

(52) U.S. Cl.
CPC .... *H04R 19/005* (2013.01); *H01L 2924/10253* (2013.01); *H01L 2224/48227* (2013.01); *H01L 2224/48091* (2013.01); *H01L 2224/48465* (2013.01); *H01L 2924/01079* (2013.01); *H01L 2924/19041* (2013.01)
USPC ........... 381/176; 381/184; 381/398; 381/399; 381/423; 438/689; 257/E23.106

(58) Field of Classification Search
USPC ................ 381/176, 184, 186, 398, 399, 423; 216/20, 33; 257/E23.106; 438/689
See application file for complete search history.

(56) References Cited

U.S. PATENT DOCUMENTS

| | | |
|---|---|---|
| 2,775,733 A | 12/1956 | Winograd |
| 4,451,773 A | 5/1984 | Papathomas et al. |
| 6,859,374 B2 | 2/2005 | Pollanen et al. |
| 7,330,363 B2 | 2/2008 | Ponnaluri et al. |

*Primary Examiner* — Ha Tran T Nguyen
*Assistant Examiner* — Suberr Chi
(74) *Attorney, Agent, or Firm* — One LLP

(57) ABSTRACT

A micromachined microphone or speaker embedded within, or positioned on top of, a substrate suitable for carrying microelectronic chips and components. The acoustic element converts sound energy into electrical energy which is then amplified by electronic components positioned on the surface of the substrate. Alternatively, the acoustic element may be driven by electronics to produce sound. The substrate can be used in standard microelectronic packaging applications.

2 Claims, 10 Drawing Sheets

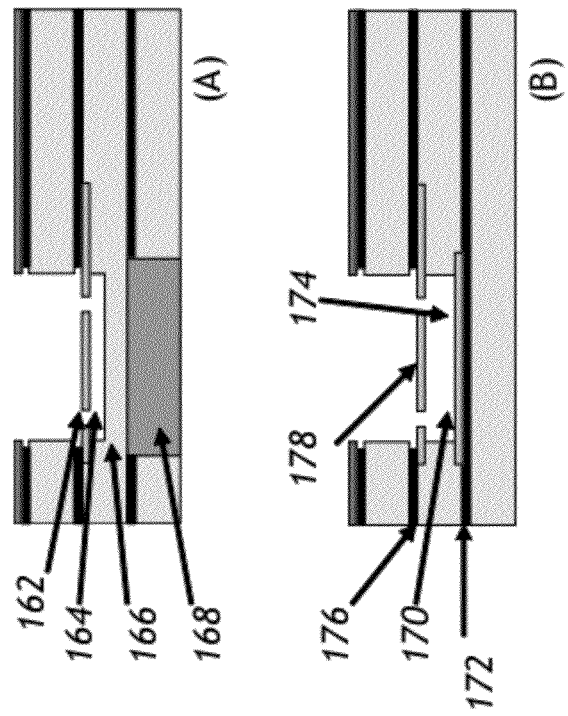
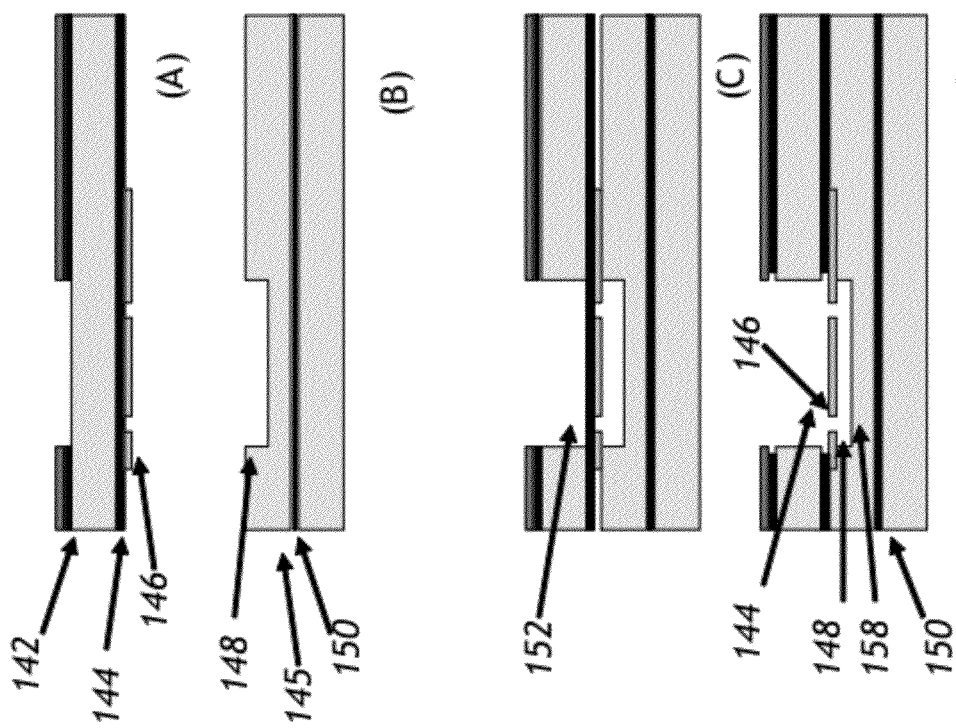
FIGURE 9
FIGURE 8

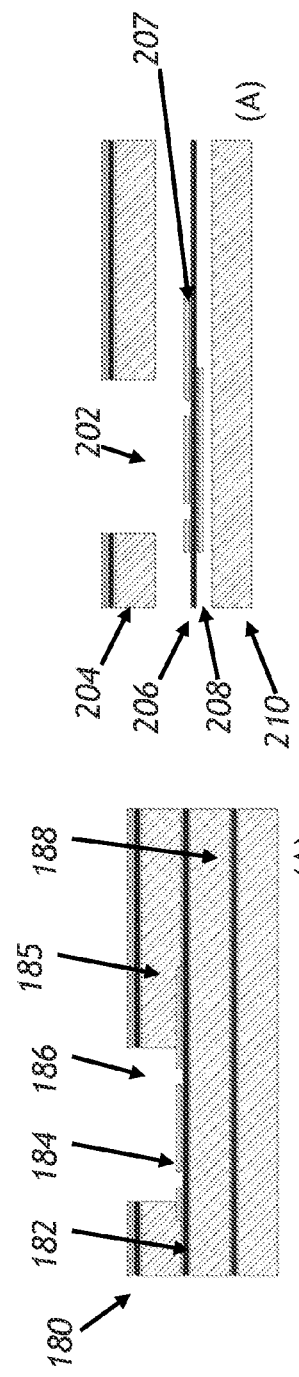
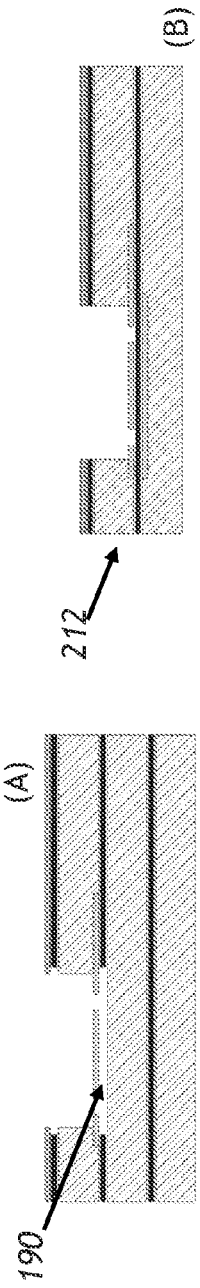
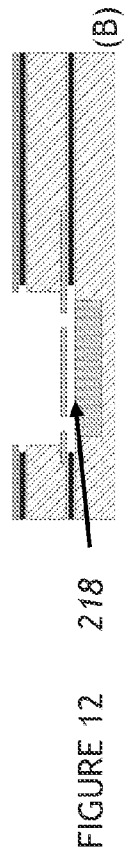
FIGURE 10
FIGURE 11
FIGURE 12

ACOUSTIC SUBSTRATE

CROSS-REFERENCE TO RELATED APPLICATIONS

This application is a divisional of application Ser. No. 11/956,756 filed Dec. 14, 2007, which claims the benefit of U.S. provisional application Ser. No. 60/870,354 filed Dec. 15, 2006, both of which are incorporated by reference herein.

FIELD OF THE INVENTION

The present invention relates to micromachined microphones and speakers and, more particularly, to an acoustic device that is microfabricated directly within or on a laminate substrate or lead frame. This enables new manufacturing processes to be applied to the manufacture of microacoustic devices, and making it easy to integrate into standard printed circuits and microelectronic packages.

BACKGROUND OF THE INVENTION

Micromachined microphones, often called "MEMS microphones" (MEMS refers to micro-electrical mechanical systems), have become an attractive alternative to conventional condenser or electret microphones. Condenser and electret microphones utilize a diaphragm that responds to sound by vibrating. The vibrations of the membrane are monitored by monitoring the capacitance of the gap between the diaphragm and a conducting plate that is close to the diaphragm. In the case of a condenser microphone, the diaphragm is made from a conductive material and is then charged using an external bias (typically in the range of 40V). For an electret microphone, the diaphragm is made from a dielectric material, usually polymer such as Teflon™, and is permanently charged during manufacture by ion implantation. The movement of the diaphragm in both condenser and diaphragm is monitored by amplifying the fluctuating voltage on the conductor that sits below the diaphragm. Since the gap between the diaphragm and conductive plate determines the capacitance of the system, the position of the diaphragm determines the electrical signal. Other methods for monitoring the movement of a diaphragm or ribbon have been developed using magnetic fields. These are known as dynamic microphones since the velocity of the moving element determines the electrical signal. Finally, still other methods for monitoring the position of a diaphragm have been developed, for example the use of a laser to monitor deflection or by frequency modulation in an AC circuit. However, the most popular microphone technology, by far, is the electret microphone.

MEMS microphones are now challenging electret microphones for market acceptance. MEMS microphones are almost exclusively built from silicon substrates using semiconductor microfabrication techniques. Since they use lithographic semiconductor processes, these microphones can be built with precise features and extremely small gaps between the diaphragm and conducting plate below the diaphragm, on the order of a few micrometers. This can increase the sensitivity of the microphone, at least in principle. In practice, MEMS microphones are not more sensitive than traditional microphones because they must use semiconductor-style materials such as silicon, silicon dioxide, or silicon nitride which are much stiffer than polymer, and because their diaphragm areas are smaller. However, MEMS microphones can be made smaller than traditional microphones and, since they are made from non-polymer materials, the MEMS microphones can handle higher temperatures than electrets. This makes them attractive for integrating in wave soldering manufacturing, where entire printed circuit boards must be exposed to heat in order to solder all components on the boards at once. Traditional electret microphones cannot survive wave soldering, and typically lose sensitivity in the process, so must be assembled onto an electronic circuit after the wave soldering step.

Some MEMS microphones build amplification and digitization electronics directly on the same substrate as the diaphragm. This reduces the size needed for the microphone and, in principle, reduces cost since a second amplifier chip is not necessary. In practice, cost is not necessarily reduced because the diaphragm manufacture does not use completely standard semiconductor processing and so the devices do not benefit from the semiconductor process to the same degree as standard CMOS electronic devices do. Furthermore, the diaphragm itself takes up considerable space on the silicon which increases cost since the cost of silicon microfabrication is almost proportional to surface area of silicon. Most MEMS microphones use separate amplifier chips which are connected to the diaphragm device during final package assembly.

All silicon MEMS microphones suffer from the need to assemble the MEMS device together with other electrical components, such as amplifier chips, passive devices and conductive leads, and further to place into a protective package. The problem with MEMS packaging is well known, and still plagues the MEMS industry. The MEMS device is typically built on a silicon wafer, but must be cut out and transferred to a metal or laminate substrate where it is electrically connected to connections on the substrate. Since the MEMS device is very fragile, this assembly is a difficult and expensive operation and is currently the cost limiting step in MEMS manufacturing. Any innovations that can simplify or eliminate this step would significantly impact the ability to deploy MEMS microphones.

The current state of art does not provide a satisfactory way to construct a micromachined microphone or micro-speaker that is truly compatible with the packaging of the acoustic device and its associated electronics. A device that can be readily constructed that is compatible with standard packaging techniques would be desirable.

SUMMARY OF THE INVENTION

The various embodiments and examples provided herein are generally directed to systems and methods for producing micromachined microphones or speakers on lead frames or laminate substrates. Preferred embodiments comprise a laminated substrate or metal lead frame where the acoustic elements have been fabricated directly within or on the surface of the substrate or lead frame. This substrate or lead frame is then used as a substrate for further packaging operations, such as die attach or component assembly. Effectively, this invention puts the micromachined microphone or speaker in the electronic package material, before microelectronic packaging has commenced.

Microelectronic packaging uses highly developed, advanced manufacturing techniques. First, a laminate substrate or lead frame is prepared to act as the main surface for the microelectronic components that are to be assembled together. In the case of a lead frame, the starting surface is made from conductive metal (such as copper) that is precision cut using laser or other machining tools to produce conductive leads. Electronic components such as silicon dies are attached to the leads using adhesives, then electrical connections are made from the component to the lead frame using thin wires (wire bonding), flip chip soldering, surface mount soldering, or other standard techniques. When all electrical connections have been made, the device is encapsulated in a protective polymer to produce a final "packaged" microelectronic chip.

In the case of a substrate, the starting surface is made from laminated layers of metal and polymer (typically fiberglass or resin). These may be constructed to produce complex 3-D arrangements of interconnects within the laminate layers. Electronic components such as silicon dies or other elements are attached to the surface of the laminate structure using adhesives, then tiny electrical connections are made from the component to the lead frame using thin wires (wire bonding), flip chip soldering, surface mount soldering, or other standard techniques. When all electrical connections have been made, the device is encapsulated in a protective polymer or capped using a housing structure to produce a final "packaged" microelectronic chip.

The present invention describes the fabrication and/or placement of a micromachined microphone or speaker within or on the laminate structure prior to attachment of electronic components on the surface of the laminate. By natural extension, this invention also describes a microphone or speaker fabricated on a lead frame prior to electronic attachment.

Other objects and features of the present invention will become apparent from consideration of the following description taken in conjunction with the accompanying drawings.

BRIEF DESCRIPTION OF THE FIGURES

The details of the invention, both as to its structure and operation, may be gleaned in part by study of the accompanying figures, in which like reference numerals refer to like parts. The components in the figures are not necessarily to scale, emphasis instead being placed upon illustrating the principles of the invention. Moreover, all illustrations are intended to convey concepts, where relative sizes, shapes and other detailed attributes may be illustrated schematically rather than literally or precisely.

FIG. 8 is a diagram showing a method for fabricating an acoustic element within a substrate.

FIG. 9 is a diagram showing method of fabricating an acoustic element with an electret and with all-air gap.

FIG. 10 is a diagram showing second method for creating free-standing structure in laminate.

FIG. 11 is a diagram showing third method for creating free-standing structure in laminate.

FIG. 12 is a diagram showing method fabricating an acoustic element with an electret and with all-air gap.

DETAILED DESCRIPTION OF THE PREFERRED EMBODIMENTS

Figure 1:
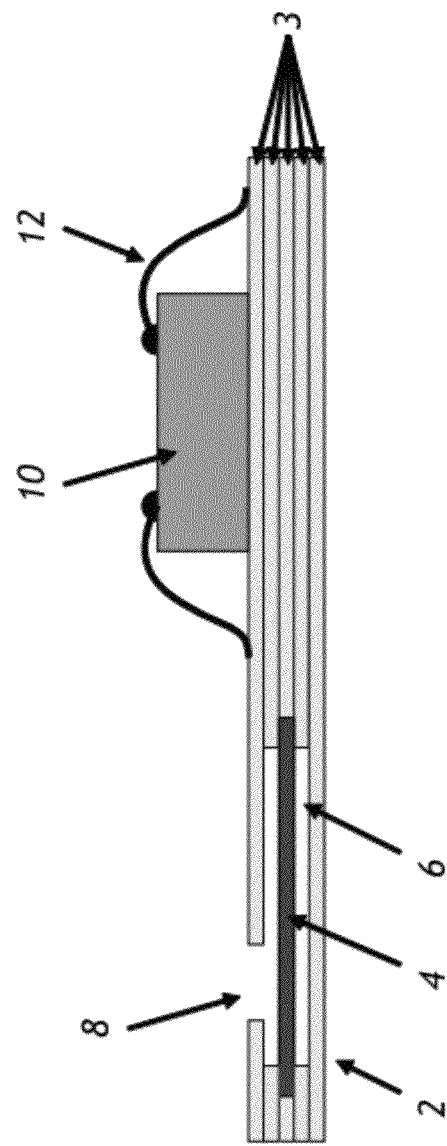
FIG. 1 is across sectional view of the acoustic substrate showing the acoustic element buried within a laminate structure and a microelectronic chip mounted on the surface.

Each of the additional features and teachings disclosed below can be utilized separately or in conjunction with other features and teachings to provide an acoustic sensor or actuator that is embedded or on the surface of a laminate substrate or lead frame. Representative examples of the present invention, which examples utilize many of these additional features and teachings both separately and in combination, will now be described in further detail with reference to the attached drawings. This detailed description is merely intended to teach a person of skill in the art further details for practicing preferred aspects of the present teachings and is not intended to limit the scope of the invention. Therefore, combinations of features and steps disclosed in the following detail description may not be necessary to practice the invention in the broadest sense, and are instead taught merely to particularly describe representative examples of the present teachings.

Moreover, the various features of the representative examples and the dependent claims may be combined in ways that are not specifically and explicitly enumerated in order to provide additional useful embodiments of the present teachings. In addition, it is expressly noted that all features disclosed in the description and/or the claims are intended to be disclosed separately and independently from each other for the purpose of original disclosure, as well as for the purpose of restricting the claimed subject matter independent of the compositions of the features in the embodiments and/or the claims. It is also expressly noted that all value ranges or indications of groups of entities disclose every possible intermediate value or intermediate entity for the purpose of original disclosure, as well as for the purpose of restricting the claimed subject matter.

The various embodiments provided herein are generally directed to systems and methods for producing acoustic elements that can be embedded within laminate substrates, or fabricated on the surface of laminate substrates or lead frames. A preferred embodiment comprises a laminate substrate consisting of a conducting layer, a non-conducting layer, and a second conducting layer built on the non-conducting layer. The second conducting layer is patterned to produce free-standing structures with a cavity that is formed between the free-standing structures and the non-conducting layer. This can be performed through a variety of means, such as providing an offset for the free-standing structures, or by producing an opening in the non-conducting layer. When oscillating air pressure is present (in the form of sound), the free-standing structures can move with the sound waves and their positions electronically detected by the first conductive layer. Electrical detection can occur through conventional means such as monitoring the changing capacitance with a resonance circuit, or by biasing one of the two conductive layers and amplifying the resulting signal.

Referring to FIG. 1, the basic device comprises a laminate structure (2) comprising multiple layers (3), preferably conductive and non-conductive layers. Laminates are usually films or foils that are bonded together using adhesive and pressure to produce a single flat substrate that consists of the films and foils as layers in the substrate. Other varieties of laminates are also common, such as those formed lithographically by photo-sensitive polymers. An acoustically sensitive element (4) is placed or formed within a cavity (6) which is formed from openings in the layers (3). The element (4)

makes electrical contact with one or more conductive layers in the laminate. The cavity (6) above and below the acoustically sensitive element (4) may be covered with more laminates encasing the acoustically sensitive element within an enclosed cavity. Openings or ports (8) in laminate layers (3) may be formed to provide access for air which will increase sensitivity of the acoustic element (4). Alternatively, the acoustic element (4) may be fully exposed to air. The substrate (2) thus formed may be used as a base substrate for further assembly of electrical components such as electronic chips (10) which are bonded to the substrate and electrically connected to conductive elements on the substrate using conventional means, such as wire bonds (12), flip chip bonding, surface mount soldering, and the like.

Figure 2:
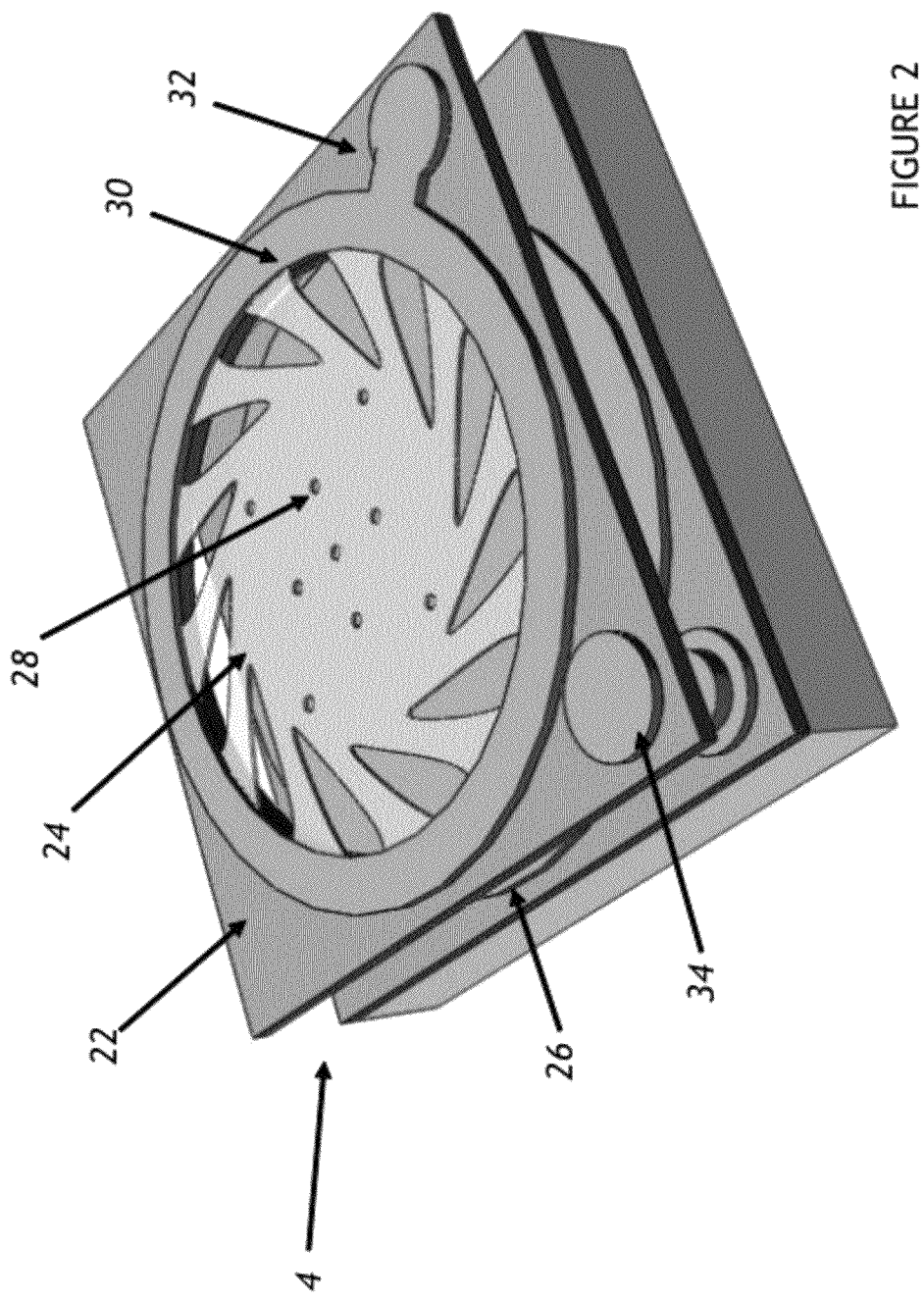
FIG. 2 is a perspective view of an acoustic diaphragm element integrated with laminate materials.

Many types of acoustic devices can be used as the acoustic element. We describe three types of devices here: a diaphragm device, a multi-resonator device, and a ribbon device. Referring to FIG. 2, the acoustic element (4) consists of a laminate layer (22) with a thin diaphragm layer (24) that is suspended above a conductive base layer (26). The thin diaphragm (24) may be made from a conductive material forming a capacitor (condenser microphone), or from an insulating material that is given an electric charge (electret microphone). The diaphragm (24) may have openings (28) such as holes ("release holes") to aid in the passage of etching chemicals during manufacture. In a preferred embodiment, the thin diaphragm (24) is connected to a second conductive layer (30) in the laminate (22), which is in turn patterned to produce an electrical trace (32) which can be connected to other conductive traces in the laminate material.

The conductive base layer (26) is made from one of the conductive layers in the laminate, which is patterned to produce an electrical trace which can be connected to other conductive traces in the laminate material such as vias (34). The conductive traces in the laminate material are patterned to produce convenient connection pads for electronic components such as an amplifier.

In the presence of alternating air pressure, the diaphragm (24) moves causing a change in capacitance which can be detected by an amplifier that connects to one or both of the conductive traces (32) and (34). This description describes a direct air gap between the diaphragm (24) and the base conductor (26). In an alternate embodiment, an additional non-conducting layer may be positioned between the air gap and the conducting base to prevent accidental short circuit between the conductive diaphragm (24) and the conductive base layer (26), or to ease fabrication. In another alternate embodiment of this acoustic device (4), the diaphragm (24) may be made of an insulating, charged material and the base layer (26) may be made of a conducting material to form an electret microphone. In another alternate embodiment of this acoustic device (4), the diaphragm (24) may be made of conductive material and the base layer (26) may be made of an insulating, charged material to form an electret microphone.

Figure 3:
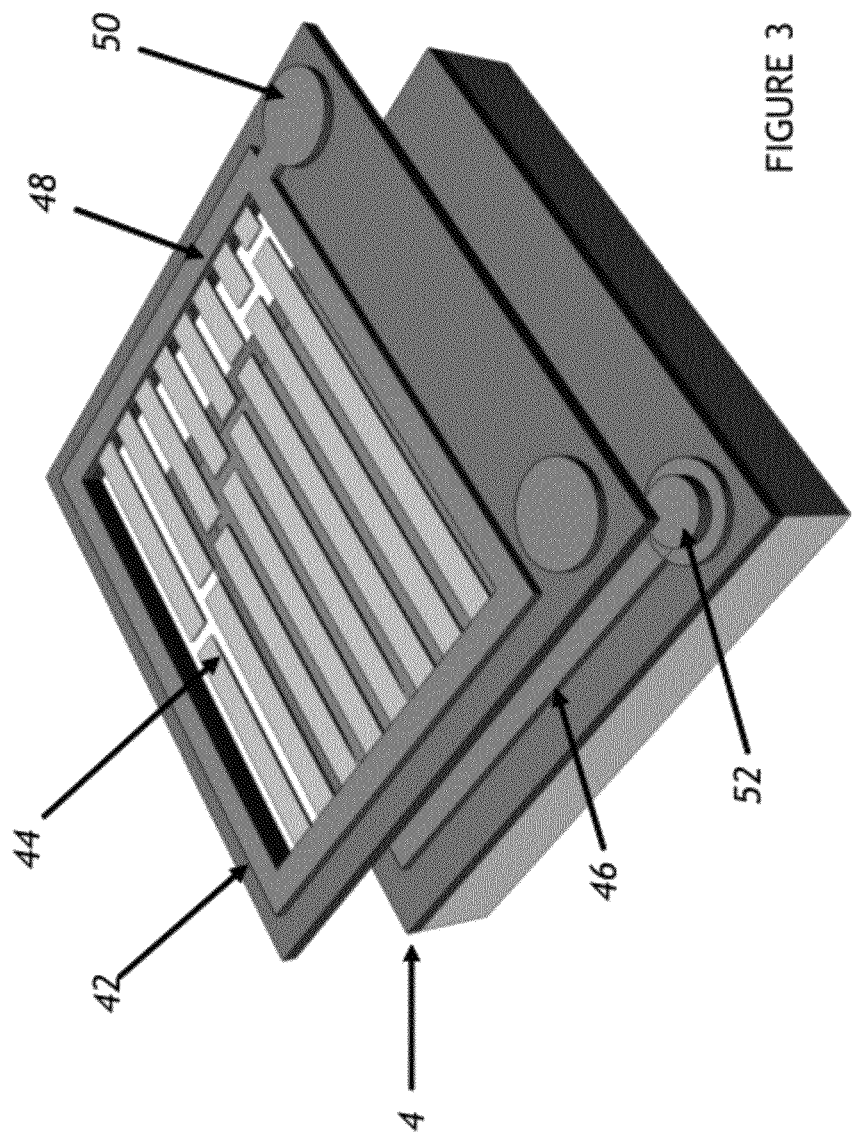
FIG. 3 is a perspective view of acoustically sensitive resonator array element integrated with laminate materials.

Referring to FIG. 3, the acoustic element (4) may consist of a laminate layer (42) supporting resonating elements such as cantilevers (44). These elements (44) resonate in sympathetic vibration with the alternating air pressure. By using multiple resonators, or by designing resonating elements with many resonant modes, a broadband frequency response can be obtained. Since the acoustic elements work in resonant operation, the device is capable of higher sensitivity than a normal diaphragm.

The resonating elements (44) are suspended above a conducting layer (46) as with the diaphragm. As with the diaphragm, electrical contacts (48) are made to the resonating layer (44) and patterned into conductive traces (50) that can be routed through the laminate structure. The base conductor (46) is also patterned to form traces (52) which can be routed through the laminate, including through vias.

This description describes a direct air gap between the resonators (44) and the base conductor (46). In an alternate embodiment, an additional non-conducting layer may be positioned between the air gap and the conducting base (46) to prevent accidental short circuit between the conductive resonators (44) and the conductive base layer (46), or to ease fabrication. In another alternate embodiment of this acoustic device (4), the resonating elements (44) may be made of conductive material and the base layer (46) may be made of a charged insulating material, forming an electret microphone.

Figure 4:
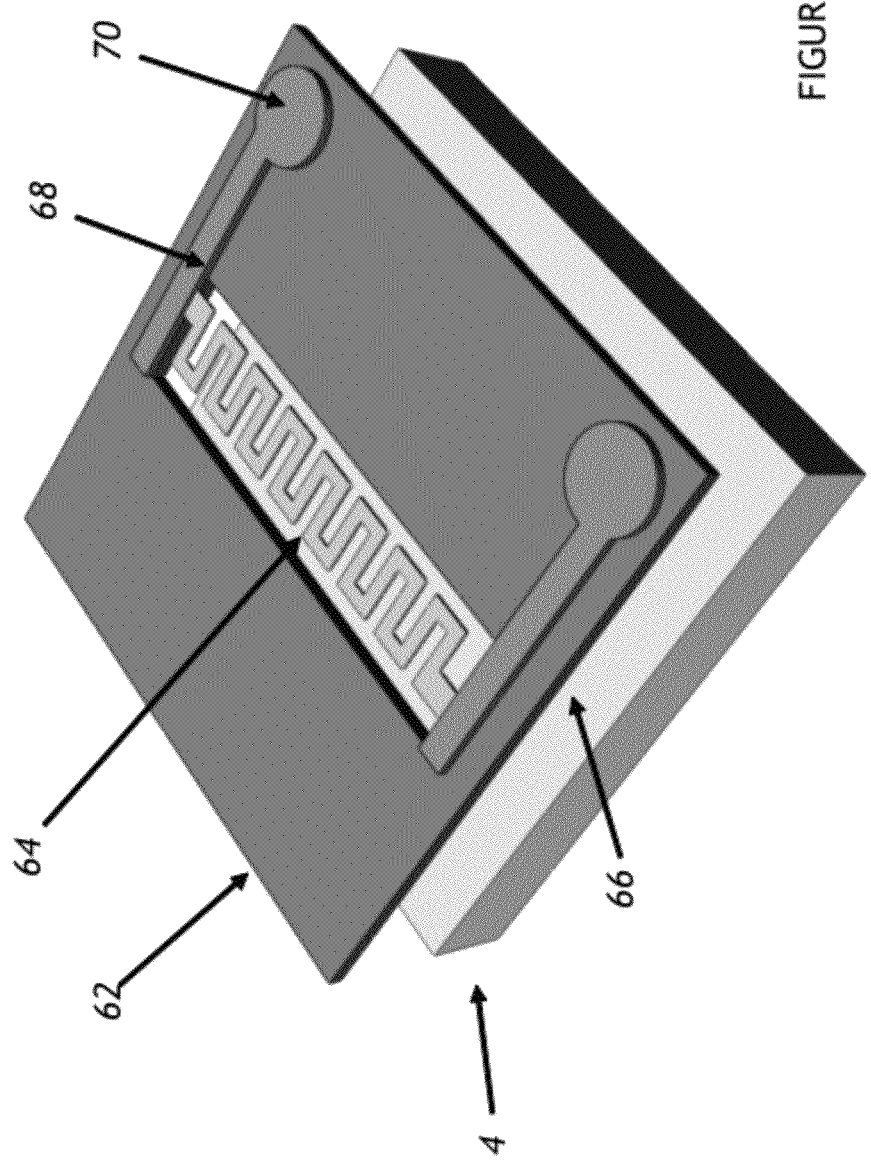
FIG. 4 is a perspective view of acoustically sensitive ribbon element integrated with laminate materials.

Referring to FIG. 4, the acoustic element (4) may consist of a laminate layer (62) supporting a thin ribbon (64) formed of conductive material. The ribbon (64) may be shaped to form a corrugated structure or a meandering structure in order to reduce the effective spring constant of the ribbon (64). The ribbon (64) is held in place over a supporting layer (66) by the laminate layer (62). Changing air pressure moves the ribbon material (64). If the ribbon (64) is placed in the presence of a magnetic field, formed using an external magnet (not shown), then movement in the ribbon (64) will result in an induced voltage in the ribbon. This voltage can be routed to an amplifier by conductive traces (68) patterned on the layer (62) which can be routed, if desired, to different layers by vias (70). Additionally, magnetic materials such as permalloy may be added in the form of laminate layers to improve the magnetic field surrounding the ribbon.

Figure 5:
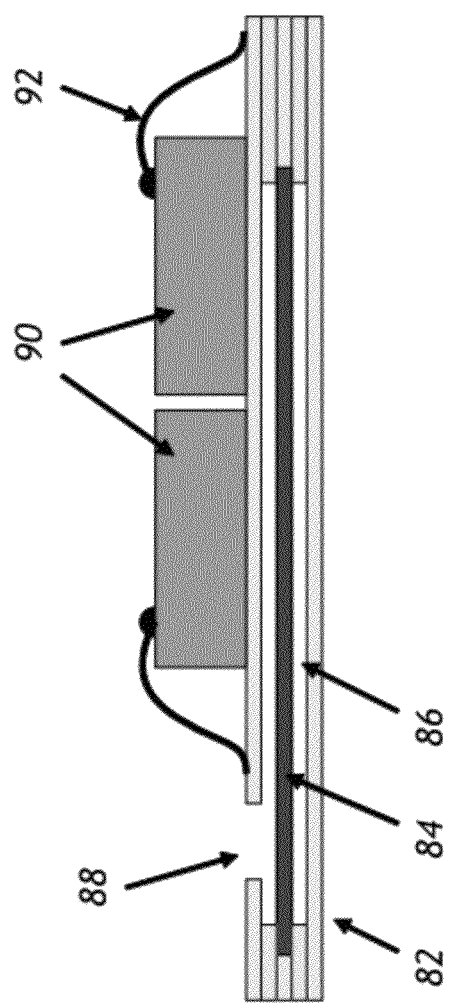
FIG. 5 is a cross section view of an acoustic element buried under laminate allowing more space for more electronic components.

Referring to FIG. 5, the laminate substrate (82) may completely encapsulate the acoustic element (84) within a cavity (86). Further laminates may be added to enclose the acoustic element (84), providing openings (88) for air to pass at convenient locations (88). This may be done to protect the acoustic element (84), or to improve acoustic properties, or to create more surface area for components to be assembled above the acoustic element area. If laminate layers are used to completely cover the active area, i.e., the acoustic element (84), more room will be made available for electronic components (90) to be mounted to the substrate (82) and electrically connected to conductive elements using conventional means such as, e.g., wire bonds (92). This can reduce the overall size of the packaged device. Additionally, the acoustic area may be made very large since electrical components (90) may be mounted directly above (or below) the acoustic element (84).

Figure 6:
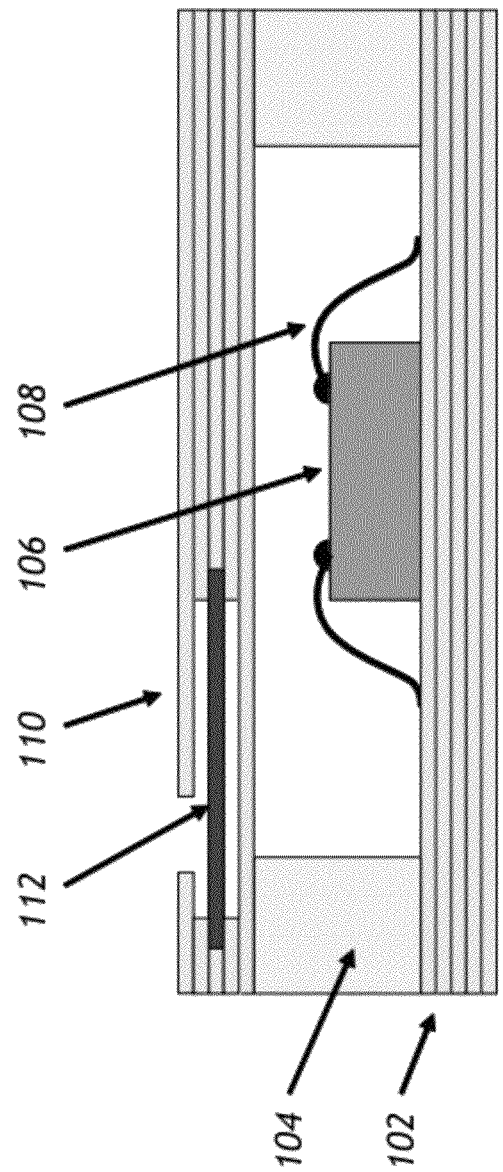
FIG. 6 is a cross section view of an acoustic element in laminate where the laminate is used as part of protective package instead of base for electronic chip attachment.

Referring to FIG. 6, the acoustic substrate (110) may be used as part of a microelectronic package housing instead of a base plate on which to attach microelectronic parts. In this embodiment, a standard laminate substrate (102) is used to mount microelectronic chips (106) which are electrically connected with connectors (108) to conductors on the surface. Spacers (104) around the edges of the laminate substrate (102) are used to provide a vertical offset. The spacers (104) provide electrical connections from the bottom substrate (102) to the top laminate (110) that contains the acoustic element (112). The top laminate (100) caps the package, providing protective covering for the microelectronics (106) and also providing an acoustic function.

These embodiments illustrate the types of acoustic devices that can be embedded within, or mounted on, a laminated substrate. These embodiments also illustrate how the acoustic elements may be placed either on the substrate surface or buried within the substrate, and that the substrate may be used to mount microelectronic chips or be used for another part of the device package.

Construction of these embodiments and the like may proceed by various means. In the simplest method, the acoustic element may be fabricated separately by appropriate means. The acoustic element may then be placed within the laminate material prior to laminate bonding, forming an embedded device. Electrical contacts may be made to the acoustic element prior to lamination through conventional methods such as wire bonding, flip chip bonding, surface mount soldering, solder paste, solder bumping, and the like. To aid in manufacturing yield, the acoustic elements may be encapsulated in a temporary protective material, such as a low molecular weight polymer during the lamination process. This protective encapsulant material can be removed later by a suitable method such as dissolving in a solvent, etching in an etching solution, etching in a plasma or vapor, or heating to melt or sublimate.

An alternate method would be to build the acoustic element directly within the laminate material as part of the manufacturing process for the laminate substrate. This embodiment is discussed here.

Figure 7:
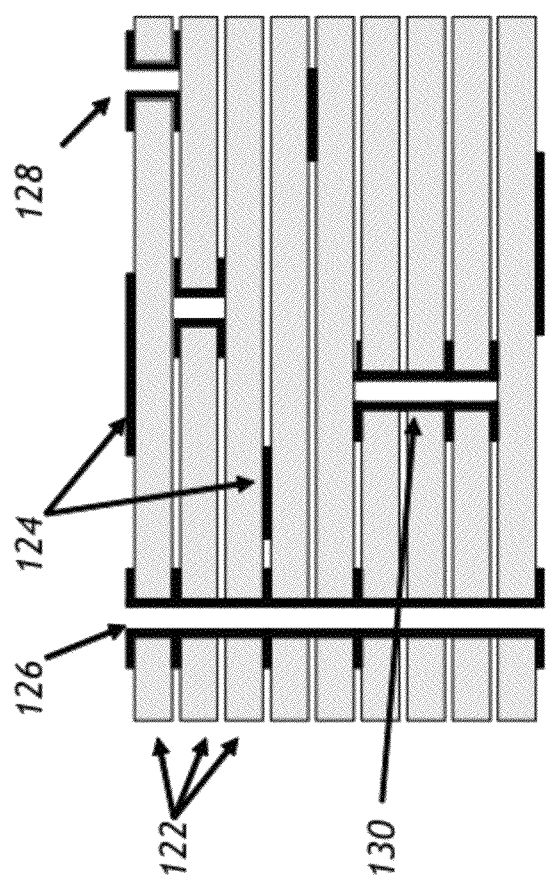
FIG. 7 is a cross section view of typical laminate substrate showing laminate layers and vias.

The following first describes the general manufacturing process for producing laminate substrates, and then describes the modifications needed to produce an acoustic element in the substrate. Referring to FIG. 7, laminate substrates (120) are created by first preparing sheets (122) of material, typically polymer resin called "prepreg", with metal layers (124) bonded to the top, typically copper. The copper layer (124) is patterned using lithography and etch techniques (photoengraving). Holes and other openings (126) (128) (130) are drilled or cut out of the polymer sheets (122) later using drills, routers, or laser machining tools. Each layer (122) may be subsequently treated to improve adhesion during the lamination process. Layers (122) are aligned using alignment pins or jigs and bonded together, to form a composite laminate structure. Layers (122) may be bonded one at a time, particularly when "blind vias" or "buried vias" are needed. A via (126) is an electrical contact that passes through the laminated structure (120). A "blind" via (128) is an electrical contact that passes through several laminate layers (122) but does not pass all the way through and can be seen only from one side of the laminate structure (120). A "buried" via (130) is an electrical contact that passes through several layers but cannot be seen from either side of the finished substrate (120). In the case of blind or buried vias (128) and (130), after each layer is subsequently bonded to the stack, conductive material is used to fill the holes that were drilled prior to bonding. Alternatively, all layers may be bonded in a single step, if buried vias are not needed. Finally, remaining via holes (126) are filled with metal and the laminate may be coated with patterned protective layers such as a polymer solder mask.

The following describes different methods for building the acoustic element within the laminate. In the first embodiment, shown in FIG. 8, two halves of the laminate are prepared in advance. The top half contains a laminate layer (142) and a first metal foil (144), such as copper, bonded to the laminate layer (142). A second metal foil (146), such as gold, is patterned over the first metal foil (144). The second metal is chosen for good mechanical and electrical properties, and because it is resistant to chemicals that would ordinarily etch the first metal. The second laminate layer (145) consists of laminate material that has a cavity (148) within it. The cavity (148) can be created using etching, cutting, ablation, drilling or other methods. Beneath the cavity (148) is a third metal foil (150), such as copper. The two halves (142) and (145) are bonded together to place the patterned metal over the cavity (148). An opening (152) is cut into the top layer (142) to expose the first metal foil (144). The opening (152) can be created using etching, cutting, ablation, drilling or other methods. The opening (152) may be created at any time, such as before the first foil (144) is bonded to the top laminate (142). Finally, a chemical etchant is introduced into the opening to etch the first metal foil (144). In the preferred embodiment, the etchant may be ammonium persulfate or ferric chloride which efficiently etch copper but which do not etch gold. The etching process removes the first metal layer (144) but does not affect the second patterned metal (146). This "release etch" leaves a freestanding movable structure (156) which can be used as the acoustic element. Electrical acoustic of the movable structure can occur at the third metal layer (150) that monitors the change in capacitance through the cavity (148) and laminate material (158).

A variation of this embodiment may be realized by substituting the second layer with a laminate containing a charged electret, as seen in FIG. 9A. In this device, the freestanding structure (162) is suspended over a cavity (164) which is created in a laminate layer (166) and which also contains a charged electret material (168). A still different embodiment can be accomplished if the design requires an all-air gap between the two conductive layers. In this embodiment, a cavity (170) is created that passes through the laminate to the third metal foil (172). If the third metal foil (172) is made from a suitably different metal than the first metal foil (176), the release etching will not harm this metal layer. Alternatively, layer (174) comprised of a fourth metal may be patterned over the third metal foil (172). This metal is selected to be resistant to the etchant used to remove the first metal foil. The bottom layer (172) of metal is protected during the release etch. This leaves two metals (174) and (178) separated by an air gap at the completion of etching.

Another embodiment of the manufacturing process is shown in FIG. 10. Here a metal foil (182), preferably copper, is prepared as usual on the surface of a laminate layer (188). A second metal (184), preferably gold, is patterned on top of the first metal foil, having different etch properties from the first. A new laminate layer (185) containing an opening (186) is bonded to the first layers (188) to complete the laminate structure (180). The first metal (182) is etched using an appropriate chemical to leave a thin open cavity (190) below the second patterned metal (184), thus releasing the metal and yielding a free-standing structure. Etchant chemical may access the metal foil through openings in the patterned metal. The first layer (188) may be a dielectric or may contain charged elements making the device an electret. If the layer (188) is non-conductive, then acoustic of the acoustic element can occur at conductive layers below the non-conductive layer.

Another embodiment of the manufacturing process is shown in FIG. 11. In this embodiment, a top laminate layer (204) is prepared having an opening (202) in it. A metal foil (206), preferably copper, is prepared with a second metal (207) patterned on its top side and a third metal (208) patterned on its bottom side. The patterned metal is preferably gold. A second laminate layer (210) is also prepared. The two layers are bonded together with the patterned metal foil to form a single laminate construction (212). Etchant is introduced through the opening in the second patterned metal. The patterned metal should be resistant to the etchant, whereas the foil should be attacked by the etchant. Possible etchants are ammonium persulfate or ferric chloride which will etch copper but will not etch gold. Etching chemical can reach the foil through openings in the top patterned metal layer. After etching, only the patterned metal remains, leaving a free standing structure which is the acoustic element (214).

A variation on this embodiment is shown in FIG. 12. In this version, a charged dielectric (216) is placed under the patterned metal. After etching the metal foil, the freestanding metal is positioned over an air gap (218) and an electret, forming a microphone.

Similar embodiments can be envisioned on substrates that do not have laminate structure, but are still used for packaging, for instance metal lead frames. A metal lead frame is often used for mounting microelectronic chips and providing electrical connections to the chip. The lead frame is first cut from a single sheet of metal into its desired shape. Following this, microelectronic chips and other electrical components are attached to the surface of the lead frame, then electrical connections are made between the chip and the lead frame using techniques such as wire bonding, flip chip bonding, surface mount soldering, and the like. Finally, the circuitry is embedded within a mold compound which protects the electronics and forms the shape of the final packaged product. No MEMS device can survive this process.

Figure 13:
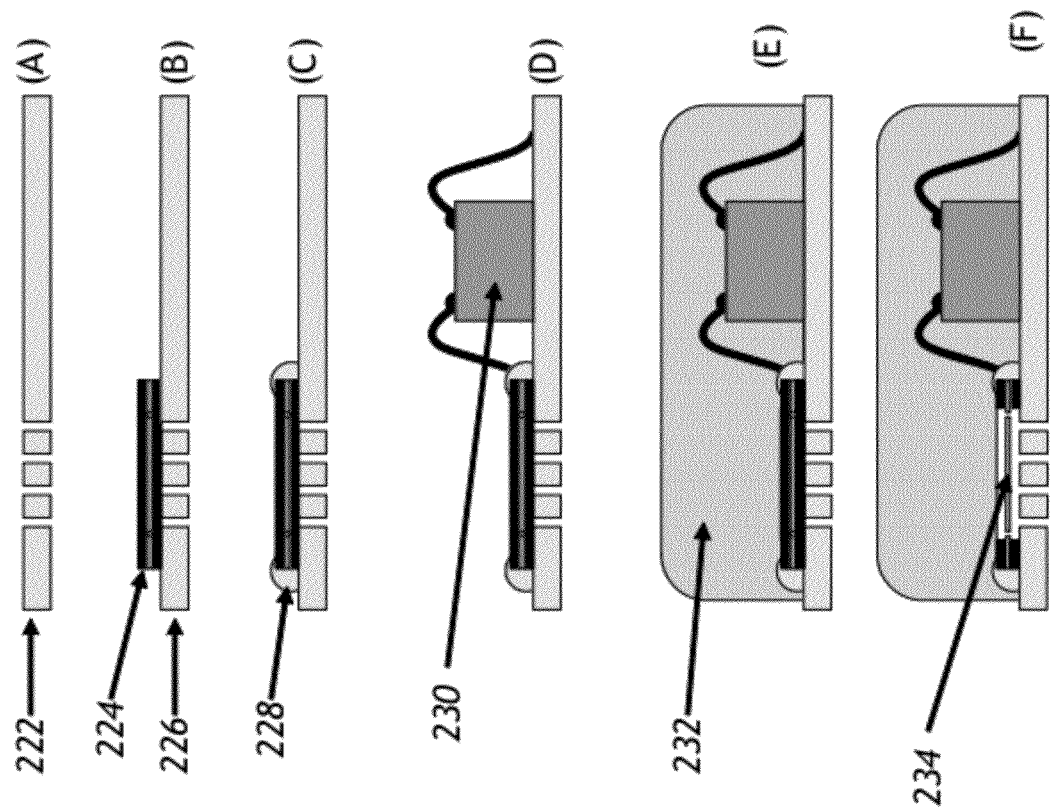
FIG. 13 is a diagram showing method for fabricating an acoustic element on a lead frame.

The following describes a method for building a microacoustic element that can be packaged on a lead frame. The basic procedure is illustrated in FIG. 13. First, a lead frame (222) is created using standard methods, such as cutting. The lead frame (222) should have small holes or openings in it to allow access to the acoustic section. Second, a metal laminate structure (224) is prepared consisting of a first metal film, with a second metal patterned on top, and a third metal film bonded to the top. The first and third metals are constructed of a metal, preferably copper, that is different from the middle metal, preferably gold or aluminum. This metal laminate (224) is bonded to the top of the lead frame (226). Electrical connections (228) between the lead frame and the metal sandwich structure are made by any method, such as soldering or metal welding. Following this, the lead frame is used for mounting further microelectronic parts such as chips and passive components. Parts (230) are mounted and electrically connected using industry standard methods, such as pick-and-place, wire bonding, flip chip bonding, surface mount soldering, and the like. The assembly is then encapsulated in protective material (232) such as epoxy using normal packaging methods. After encapsulation, etchant is allowed to penetrate through the access holes in the lead frame to etch the metal laminate structure. The etchant is selected to etch only the first and third metal foils, and not the middle patterned metal. After etching, a free standing structure (234) is left that can be used as an acoustic device. Alternative embodiments are readily imagined by injection molding vents and acoustic ports into the encapsulant.

These embodiments are meant to be illustrative examples and not exhaustive of the types of useful acoustic devices that can be built by patterning membranes or movable structures over cavities that are within a laminate or lead frame structure, nor of the methods of manufacturing said devices.

While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents and alternatives falling within the spirit and scope of the appended claims.

The invention claimed is:

1. A method for building an acoustic element within a laminate structure comprising the steps of
    forming a first laminate structure having a first laminate layer with a first metal foil bonded to the first laminate layer,
    patterning a second metal foil over the first metal foil,
    forming a second laminate structure having a second laminate layer with a cavity formed therein and a third metal foil bonded to the second laminate layer beneath the cavity,
    bonding the first and second laminate structures together placing the patterned second metal foil over the cavity,
    forming an opening in the first laminate layer to expose the first metal foil,
    introducing a chemical etchant through the opening to etch away the first metal foil leaving the patterned second metal foil, wherein a portion of the patterned second metal foil freestanding and movable.

2. The method of claim 1 wherein the cavity in the second laminate structure passes through the second laminate layer exposing the third metal foil leaving an air gap between portions of the second and third metal foils.

* * * * *